(12) United States Patent
Iyer et al.

(10) Patent No.: US 11,114,633 B2
(45) Date of Patent: Sep. 7, 2021

(54) SOLAR ANTENNA ARRAY FABRICATION

(71) Applicant: NovaSolix, Inc., Palo Alto, CA (US)

(72) Inventors: Jyotsna Iyer, Saratoga, CA (US);
Laurence H. Cooke, Los Gatos, CA (US)

(73) Assignee: NOVASOLIX, INC., Palo Alto, CA (US)

( * ) Notice: Subject to any disclaimer, the term of this patent is extended or adjusted under 35 U.S.C. 154(b) by 345 days.

(21) Appl. No.: 15/682,646

(22) Filed: Aug. 22, 2017

(65) Prior Publication Data

US 2017/0352826 A1 Dec. 7, 2017

Related U.S. Application Data

(63) Continuation-in-part of application No. 15/661,854, filed on Jul. 27, 2017, now Pat. No. 10,622,503,
(Continued)

(51) Int. Cl.
*H01L 51/42* (2006.01)
*H01L 27/30* (2006.01)
(Continued)

(52) U.S. Cl.
CPC ........ *H01L 51/4206* (2013.01); *H01L 27/301* (2013.01); *H01L 51/0048* (2013.01);
(Continued)

(58) Field of Classification Search
CPC ........... H01L 31/035281; H01L 31/048; H01L 31/054; H01L 31/0543; H01L 31/0547; H01L 31/0201; H01L 31/09; H01L 51/0048; H01L 51/0098; H01L 51/4206; H01L 27/301; H01L 31/0475; H01L 31/108; H01L 31/1085; H01Q 1/248; Y02E 10/52; Y02E 10/549; H02S 10/00;
(Continued)

(56) References Cited

U.S. PATENT DOCUMENTS 5,043,739 A 8/1991 Logan et al.
7,354,877 B2 4/2008 Rosenberger et al.
(Continued)

FOREIGN PATENT DOCUMENTS

CN 102171811 A 8/2011
FR 2996681 A1 4/2014
(Continued)

OTHER PUBLICATIONS

Office Action dated May 29, 2018 in CN Application No. 201580071231.4.
(Continued)

*Primary Examiner* — Mayla Gonzalez Ramos
(74) *Attorney, Agent, or Firm* — Panitch Schwarze Belisario & Nadel LLP (57) ABSTRACT

A method for constructing a solar rectenna array by growing carbon nanotube antennas between lines of metal, and subsequently applying a bias voltage on the carbon nanotube antennas to convert the diodes on the tips of the carbon nanotube antennas from metal oxide carbon diodes to geometric diodes. Techniques for preserving the converted diodes by adding additional oxide are also described.

11 Claims, 5 Drawing Sheets

Related U.S. Application Data which is a continuation-in-part of application No. 15/411,396, filed on Jan. 20, 2017, now Pat. No. 10,580,920, which is a continuation-in-part of application No. 15/249,953, filed on Aug. 29, 2016, now abandoned, which is a continuation-in-part of application No. 15/133,807, filed on Apr. 20, 2016, now abandoned.

(51) Int. Cl.
*H01L 51/00* (2006.01)
*B82Y 20/00* (2011.01)
*B82Y 40/00* (2011.01)

(52) U.S. Cl.
CPC ............... *B82Y 20/00* (2013.01); *B82Y 40/00* (2013.01); *H01L 51/0098* (2013.01); *Y02E 10/549* (2013.01); *Y10S 977/742* (2013.01); *Y10S 977/834* (2013.01); *Y10S 977/843* (2013.01); *Y10S 977/948* (2013.01)

(58) Field of Classification Search
CPC ............. Y10S 977/742; Y10S 977/834; Y10S 977/843; Y10S 977/948; B82Y 20/00; B82Y 40/00

See application file for complete search history.

(56) References Cited

U.S. PATENT DOCUMENTS

| | | | |
|---|---|---|---|
| 7,354,977 | B1 | 4/2008 | Woods et al. |
| 7,431,965 | B2 | 10/2008 | Grigorian et al. |
| 7,431,985 | B2 | 10/2008 | Iwama |
| 7,679,057 | B2 | 3/2010 | Gritz et al. |
| 7,679,957 | B2 | 3/2010 | Ma et al. |
| 7,687,160 | B2 | 3/2010 | Winarski |
| 7,744,793 | B2 | 6/2010 | Lemaire et al. |
| 8,137,653 | B1 | 3/2012 | Predtechensky et al. |
| 8,803,340 | B2 * | 8/2014 | Moddel ............... H01L 45/00 257/798 |
| 2004/0085247 | A1 | 5/2004 | Mickle et al. |
| 2005/0112049 | A1 | 5/2005 | Hofmeister |
| 2005/0214198 | A1 | 9/2005 | Park et al. |
| 2007/0240757 | A1 | 10/2007 | Ren et al. |
| 2009/0128893 | A1 | 5/2009 | McCarthy et al. |
| 2009/0308443 | A1 * | 12/2009 | Cutler ............... B82Y 10/00 136/256 |
| 2010/0084475 | A1 | 4/2010 | Hata et al. |
| 2010/0244656 | A1 * | 9/2010 | Ito ............... H01Q 1/2283 313/358 |
| 2010/0263709 | A1 | 10/2010 | Norman et al. |
| 2010/0284086 | A1 | 11/2010 | Novack et al. |
| 2011/0121258 | A1 * | 5/2011 | Hanein ............... B82Y 10/00 257/9 |
| 2011/0163920 | A1 * | 7/2011 | Cutler ............... B82Y 20/00 343/701 |
| 2012/0186635 | A1 | 7/2012 | Eastman et al. |
| 2012/0206085 | A1 | 8/2012 | Stevens |
| 2012/0211063 | A1 | 8/2012 | Lee et al. |
| 2013/0249771 | A1 | 9/2013 | Kotter et al. |
| 2013/0276861 | A1 * | 10/2013 | Cooke ............... H01L 31/09 136/246 |
| 2014/0085148 | A1 * | 3/2014 | Cutler ............... H01L 31/101 343/701 |
| 2015/0130692 | A1 | 5/2015 | Cooke |
| 2015/0155396 | A1 | 6/2015 | Cooke et al. |
| 2015/0243817 | A1 | 8/2015 | Cooke et al. |
| 2016/0027949 | A1 | 1/2016 | Cooke et al. |

FOREIGN PATENT DOCUMENTS

| | | |
|---|---|---|
| TW | 201110272 A | 3/2011 |
| WO | 2007120175 A2 | 10/2007 |
| WO | 2014063149 A1 | 4/2014 |

OTHER PUBLICATIONS

Int'l Preliminary Report on Patentability dated Nov. 16, 2017 in Int'l Application No. PCT/US2016/029336.
Office Action dated Jan. 11, 2018 in U.S. Appl. No. 15/249,953, by Cooke.
Office Action dated Feb. 27, 2018 in U.S. Appl. No. 15/411,396, by Cooke.
Office Action dated Mar. 9, 2018 in U.S. Appl. No. 15/133,807, by Cooke.
Extended European Search Report dated Sep. 7, 2018 in EP Application No. 15873906.0.
Extended European Search Report dated Oct. 15, 2018 in EP Application No. 16789760.2.
Office Action dated Sep. 18, 2018 in CN Application No. 201680025443.3.
Office Action dated May 5, 2019 in CN Application No. 2015800712314.
Collinear—Definition and More from the Free Merriam-Webster Dictionary, "http://www.merriam-webster.com/dictionary/collinear", 2014.
Rows—Definition and More from the Free Merriam-Webster Dictionary, "http://www.merriam-webster.com/dictionary/rows," 2014.
Siciliano et al., "Nano-Rectenna for High Efficiency Direct Conversion of Sunlight to Electricity," presented at 17th World Micromachine Summit, Apr. 26-29, 2011.
Williams, "Rice's carbon nanotube fibers outperform copper," at "http://news.rice.edu/2014/02/13/rices-carbon-nanotube-fibers-outperform-copper-2," posted Feb. 13, 2014.
Hata, "From Super Growth to DWNT forests, CNT solids, Flexible Transparent CNT films, and Super-Capacitors and Much More," Jun. 19, 2006.
Ma et al., "The production of horizontally aligned single-walled carbon nanotubes," Carbon, 49, pp. 4098-4110, 2011.
Kumar, "Chemical Vapor Deposition of Carbon Nanotubes: A Review on Growth Mechanism and Mass Production," Journal of Nanoscience and Nanotechnology, vol. 10, pp. 3739-3758, 2010.
Office Action dated Feb. 11, 2014 in U.S. Appl. No. 13/454,155.
Office Action dated Jun. 27, 2014 in U.S. Appl. No. 13/454,155.
Office Action dated Sep. 26, 2014 in U.S. Appl. No. 13/454,155.
Office Action date Jan. 13, 2015 in U.S. Appl. No. 13/454,155.
Type—definition of type by the Free Dictionary, downloaded from web page: http://www.thefreedictionary.com/type, Download date: Mar. 9, 2015, original posting date: unknown, 1 page.
Office Action dated Mar. 17, 2015 in U.S. Appl. No. 13/454,155.
Int'l Search Report and Written Opinion dated Apr. 8, 2016 in Int'l Application No. PCT/US15/59852.
Int'l Search Report and Written Opinion dated Aug. 11, 2016 in Int'l Application No. PCT/US16/29336.
Office Action dated Nov. 14, 2016 in U.S. Appl. No. 14/582,747, by Cooke.
Office Action dated Dec. 29, 2016 in U.S. Appl. No. 15/133,807, by Gonzalez Ramos.
Office Action dated Apr. 5, 2017 in U.S. Appl. No. 14/582,747 by Cooke.
Office Action dated May 4, 2017 in U.S. Appl. No. 15/249,953, by Cooke.
Office Action dated Apr. 20, 2017 in U.S. Appl. No. 14/871,958, by Cooke.
Office Action dated Mar. 7, 2017 in U.S. Appl. No. 14/701,765, by Cooke.
Int'l Search Report and Written Opinion dated Jun. 20, 2017 in Int'l Application No. PCT/US2017/026130.
Office Action dated Jun. 8, 2017 in U.S. Appl. No. 14/701,765, by Cooke.
Int'l Preliminary Report dated Jul. 6, 2017 in PCT Application No. PCT/US2015/059852.
Office Action dated Jul. 3, 2017 in U.S. Appl. No. 15/133,807, by Cooke.
Office Action dated Jul. 27, 2017 in U.S. Appl. No. 15/411,396, by Cooke.
Office Action dated Sep. 22, 2017 in U.S. Appl. No. 13/454,155, by Cooke.

(56) References Cited

OTHER PUBLICATIONS

Office Action dated Apr. 4, 2019 in U.S. Appl. No. 15/411,396.
Office Action dated May 31, 2019 in U.S. Appl. No. 15/661,854.
Search Report dated Jul. 8, 2019 in TW Application No. 104137565.

* cited by examiner

SOLAR ANTENNA ARRAY FABRICATION

CROSS-REFERENCE TO RELATED APPLICATIONS

This application is a continuation-in-part of U.S. patent application Ser. No. 15/661,854, filed on Jul. 27, 2017, which is a continuation-in-part of U.S. patent application Ser. No. 15/411,396, filed on Jan. 20, 2017, which is a continuation-in-part of U.S. patent application Ser. No. 15/249,953, filed on Aug. 29, 2016, which is a continuation-in-part of U.S. patent application Ser. No. 15/133,807, filed on Apr. 20, 2016, all of which are incorporated herein by reference.

FIELD OF ENDEAVOR

Various aspects of this disclosure may pertain to economical manufacturing processes of visible light rectenna arrays for the conversion of solar energy to electricity.

BACKGROUND

Rectifiers for AC to DC conversion of high frequency signals have been well known for decades. A particular type of diode rectifier when coupled to an antenna, called a rectenna, has also been known for decades. More specifically, over 20 years ago, Logan described using an array of rectennas to capture and convert microwaves into electrical energy in U.S. Pat. No. 5,043,739 granted Aug. 27, 1991. However, the dimensions of the antenna limited the frequency until recently, when Gritz, in U.S. Pat. No. 7,679,957 granted Mar. 16, 2010, described using a similar structure for converting infrared light into electricity, and Pietro Siciliano suggested that such a structure may be used for sunlight in "Nano-Rectenna For High Efficiency Direct Conversion of Sunlight to Electricity," by Pietro Siciliano of The Institute for Microelectronics and Microsystems IMM-CNR, Lecce (Italy).

Still, the minimum dimensions required for such visible light rectennas are generally in the tens of nanometers. While these dimensions may be accomplished by today's deep submicron masking technology, such processing is typically far more expensive than the current solar cell processes, which require much larger dimensions.

Still, as Logan pointed out in U.S. Pat. No. 5,043,739, the efficiency of microwave rectennas can be as high as 40%, more than double that of typical single junction poly-silicon solar cell arrays, and when using metal-oxide-metal (MOM) rectifying diodes, as Pietro suggests, no semiconductor transistors are needed in the array core.

As such, it may be advantageous to be able to utilize the existing fine geometry processing capability of current semiconductor fabrication without incurring the cost of such manufacturing.

Also, recently, Rice University reported that their researchers created a carbon nanotube (CNT) thread with metallic-like electrical and thermal properties. Furthermore, carbon nanotube structures are becoming more manufacturable, as described by Rosenberger et al. in U.S. Pat. No. 7,354,977 granted Apr. 8, 2008. Various forms of continuous CNT growth may have also been contemplated, such as Lemaire et. al. repeatedly harvesting a CNT "forest" while it is growing in U.S. Pat. No. 7,744,793 granted Jun. 29, 2010, and/or put into practice using techniques described by Predtechensky et al. in U.S. Pat. No. 8,137,653 granted Mar. 20, 2012. Grigorian et al. describes continuously pushing a carbon gas through a catalyst backed porous membrane to grow CNTs in U.S. Pat. No. 7,431,985 granted Oct. 7, 2008.

Furthermore, others have contemplated using CNTs for various structures such as Rice University's CNT thread as described in "Rice's carbon nanotube fibers outperform copper," by Mike Williams, posted on Feb. 13, 2014 at: news.rice.edu/2014/02/13/rices-carbon-nanotube-fibers-outperform-copper-2; magnetic data storage as described by Tyson Winarski in U.S. Pat. No. 7,687,160 granted Mar. 30, 2010; and in particular, antenna-based solar cells, as described by Tadashi Ito et al. in US Patent Publication 2010/0244656 published Sep. 30, 2010. Still, Ito et al. did not describe methods to inexpensively construct carbon nanotube solar antennas for efficient conversion of solar energy.

SUMMARY OF VARIOUS EMBODIMENTS

Various aspects of the present disclosure may relate to ways to manufacture structures of CNT rectenna arrays for converting sunlight into electricity, which may utilize current IC manufacturing techniques and self-aligning process steps, and which may be successively used to achieve the molecular sized dimensions required for the antennas and the geometric diodes.

The structure of the rectenna array may include an array of CNT antennas connecting between interdigitated ground lines and negative voltage lines through geometric diodes. The antennas may be of varying lengths and orientations, distributed for maximum reception of the full spectrum of ambient sunlight, e.g., having ¼ wavelengths or harmonic multiples of ¼ wavelengths. Single ¼-wavelength antenna diode combinations may half-wave rectify the received light. Two coupled ¼-wavelength antenna diode combinations may full-wave rectify the received light.

In one aspect, the multi-walled carbon nanotube antennas may be constructed between interdigitated aluminum lines alternating from the ground and negative voltage lines, by growing from a nickel catalyst on the ground lines to the side walls of the negative voltage lines.

In another aspect, the diameters of the multi-walled carbon nanotubes may be determined by the processing of the catalyst coupled with the processing of the carbon nanotubes.

In another aspect, the carbon nanotubes may be subsequently used to form the geometric diodes at the tips of the carbon nanotubes through a thin layer of aluminum oxide.

In yet another aspect, the carbon nanotube antennas may be subsequently used to retain the geometric diode connections while growing a thicker protective layer of aluminum oxide.

BRIEF DESCRIPTION OF THE DRAWINGS

Various aspects of the present disclosure will now be described in connection with the attached drawings, in which.

DESCRIPTION OF VARIOUS ASPECTS OF THE PRESENT DISCLOSURE

Various aspects of the present disclosure are now described with reference to FIG. 1 through FIG. 6, it being appreciated that the figures may illustrate the subject matter of various aspects and may not be to scale or to measure.

Figure 1:
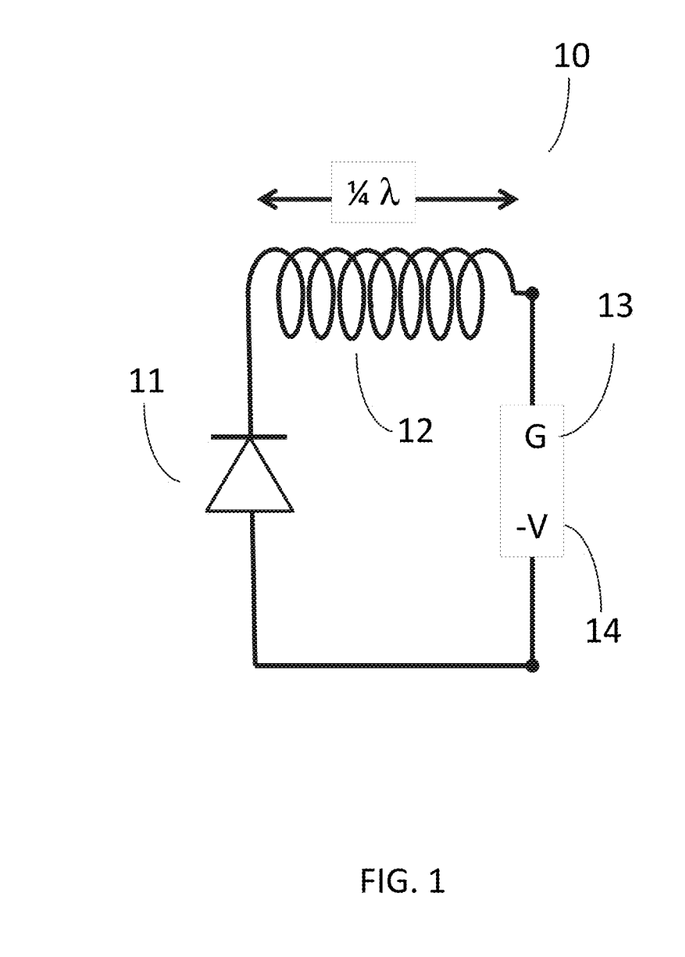
FIG. 1 is an electrical diagram of a combined diode and antenna according to an aspect of the present disclosure.
Figure 2:
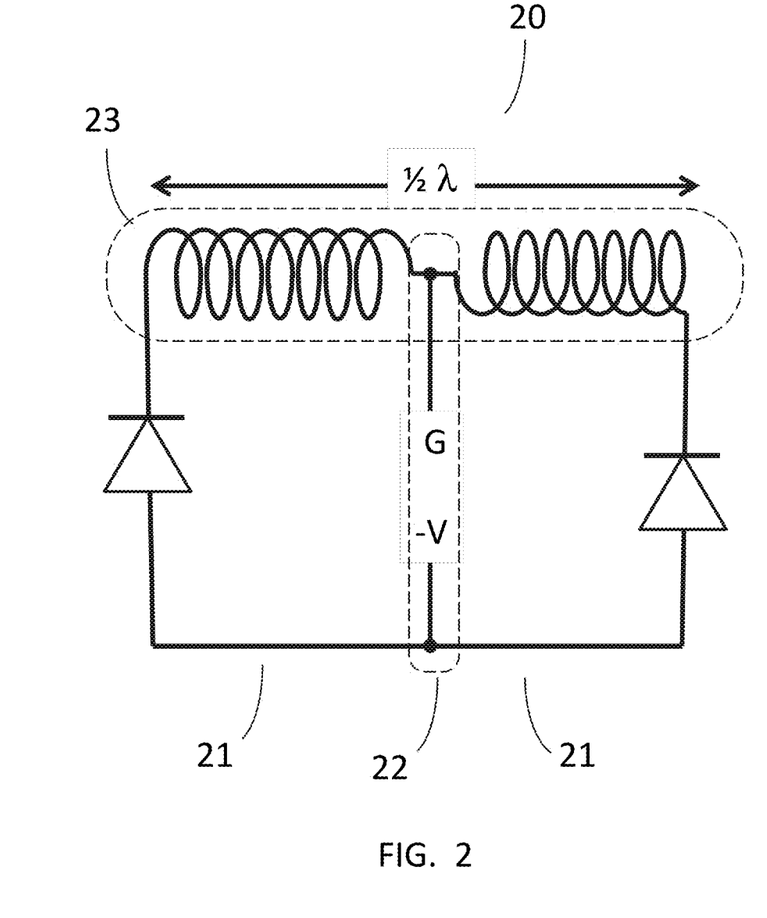
FIG. 2 is another electrical diagram of a pair of diodes and antennas according to an aspect of the present disclosure.

An electrical diagram 10 of a combined diode and antenna according to an aspect of the present disclosure is shown in FIG. 1. A diode 11 and a ¼-wavelength antenna 12 may be coupled together, with the antenna 12 further connected to a ground line 13 and the diode 11 connected to a negative voltage (−V) line 14, to form a ½-wave rectified structure. Another electrical diagram 20 of a pair of diodes and antennas according to another aspect of the present disclosure, is shown in FIG. 2. Two structures 21, each equivalent to the electrical diagram shown in FIG. 1, may be coupled to common ground and −V lines 22, to form a full-wave rectified structure.

Figure 3:
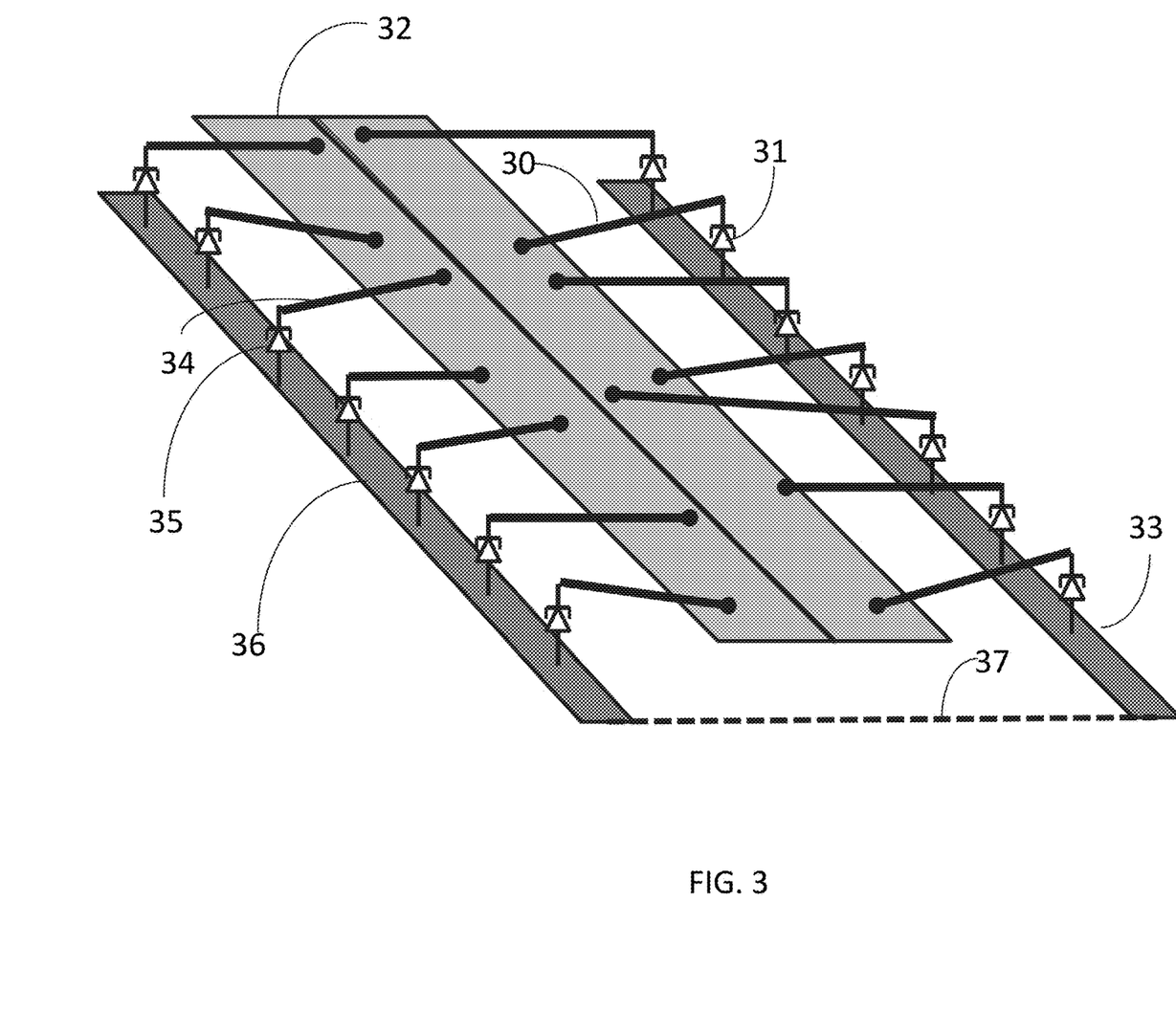
FIG. 3 is a logical diagram of an array of antennas and diodes according to an aspect of the present disclosure.

Reference is now made to FIG. 3, a conceptual diagram of an array of antennas and diodes according to an aspect of the present disclosure. The antenna 30 and diode 31 may be respectively connected to the ground line 32 and the power line 33 in a manner similar to the electrical diagram in FIG. 1. A second antenna 34 and diode 35 may be respectively connected to another side of the ground line 32 and another power line 36, which may in turn be connected 37 to the original power line. Together, the antennas 30, 34 and diodes 31, 35 may be connected to the power 33, 36 and ground 32 lines in a manner similar to the electrical diagram in FIG. 2. The antennas may be of varying lengths and may be randomly placed between the diodes and the ground line 32. The antennas may be metallic carbon nanotubes.

Figure 4:
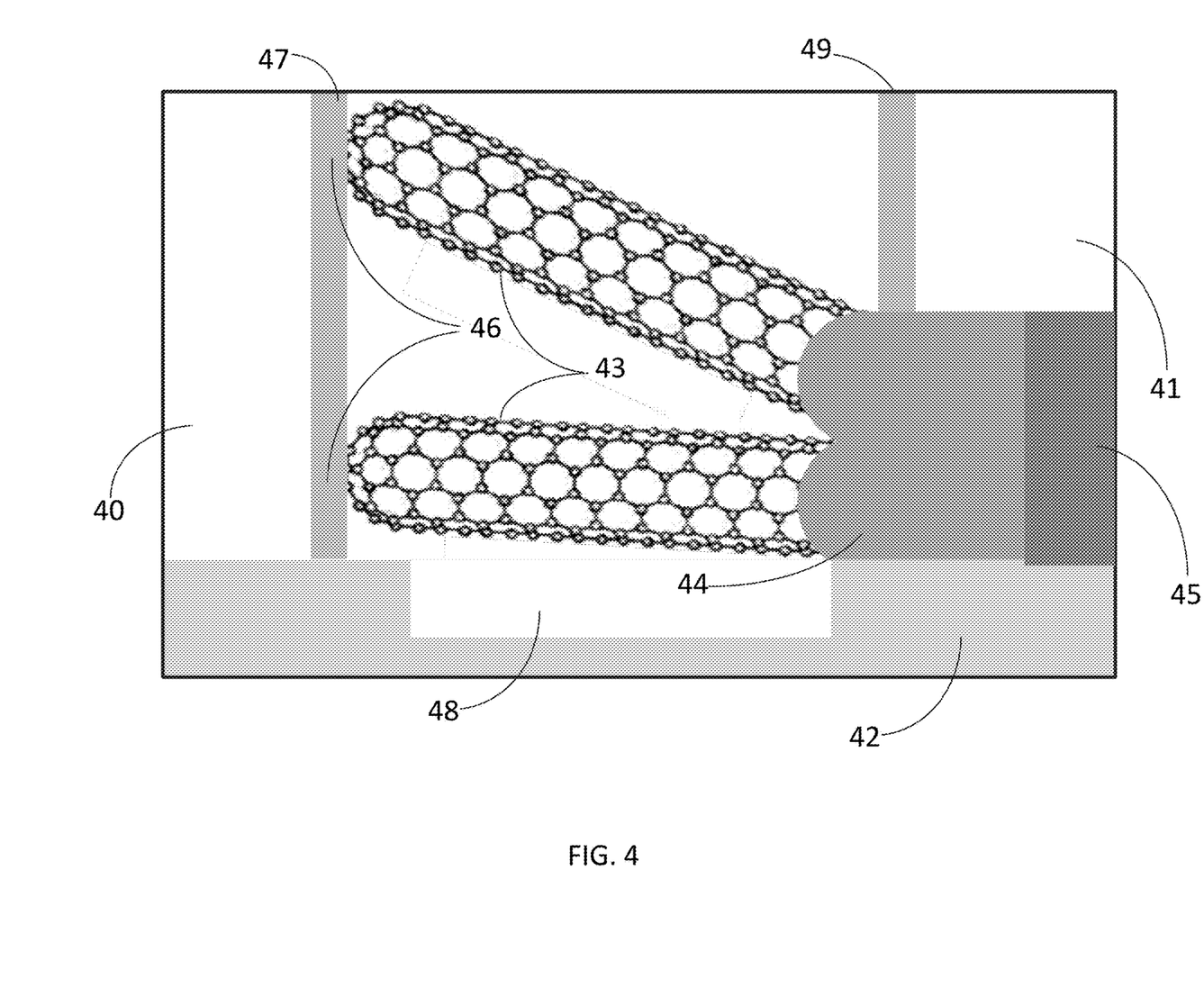
FIG. 4 through FIG. 6 are diagrams of cross-sections of an antenna array depicting multiple diode and carbon nanotube antennas according to aspects of the present disclosure.

Reference is now made to FIG. 4, a diagram of a cross-section of an antenna array, depicting multiple diodes and CNT antennas according to an aspect of the present disclosure. The antennas 43 may be either single-walled metallic carbon nanotubes, or multi-walled carbon nanotubes, which may be attached to the ground lines 41 via a catalyst 44. The catalyst may be used to grow the CNTs. The catalyst maybe composed of nickel, iron, cobalt, or some other suitable metal or alloy of metals. The catalyst may be a thin layer 44 formed by depositing and annealing the catalyst 44 on an oxide layer 45. The oxide layer 45 may be sufficiently thick to form multiple sites for carbon nanotubes. The vertical sites may aid in growing adequate densities of carbon nanotube antennas. A thin layer of oxide 47, 49 may be grown or deposited on the metal lines 40, 41. The tips 46 of the carbon nanotubes 43 may extend across a trench 48 to an oxide layer 47, forming a contact between the tip of the carbon nanotube 43 and the oxide 47. This structure may form a metal oxide carbon (MoC) diode coupling the carbon nanotube antennas 43 to the voltage line 40. The oxide may be very thin, ~one nanometer thick. The power 40 and ground 41 lines may be insulated from each other via a base 42. The base 42 may be, for example, a ceramic, glass or a plastic material. The power 40 and ground 41 lines may be composed of one or more metals such as aluminum. The ground lines 41 may be electrically connected to the catalyst 44.

Figure 5:
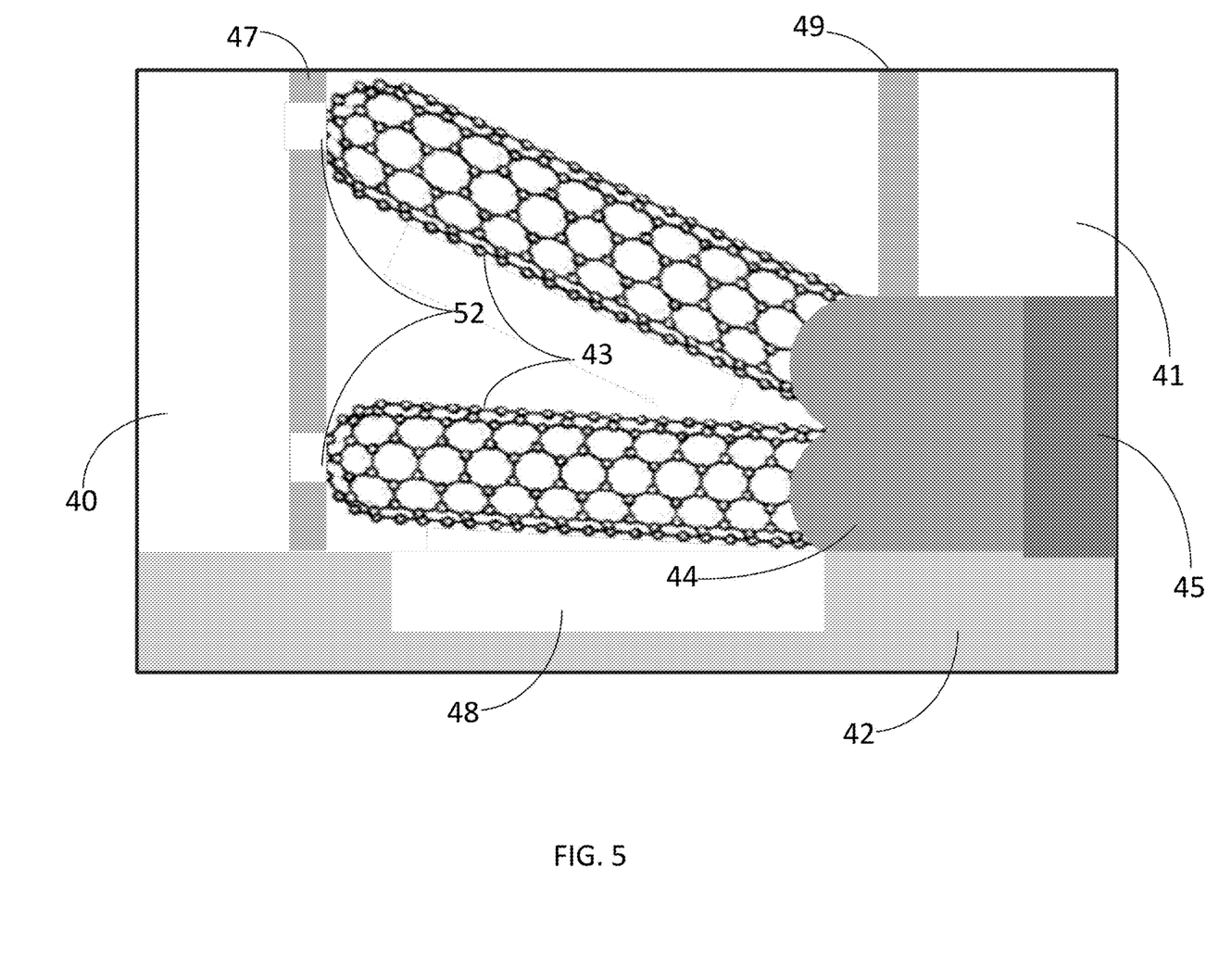

Reference is now made to FIG. 5, another diagram of a cross-section of an antenna array depicting multiple diodes and CNT antennas according to another aspect of the present disclosure. Subsequent to the formation of the MoC diodes, a bias voltage may be applied to the CNT antennas 43 sufficient enough to migrate the metal 40 through the oxide 47 to the tips 52 of the CNT antennas 43, to form geometric diodes.

Figure 6:
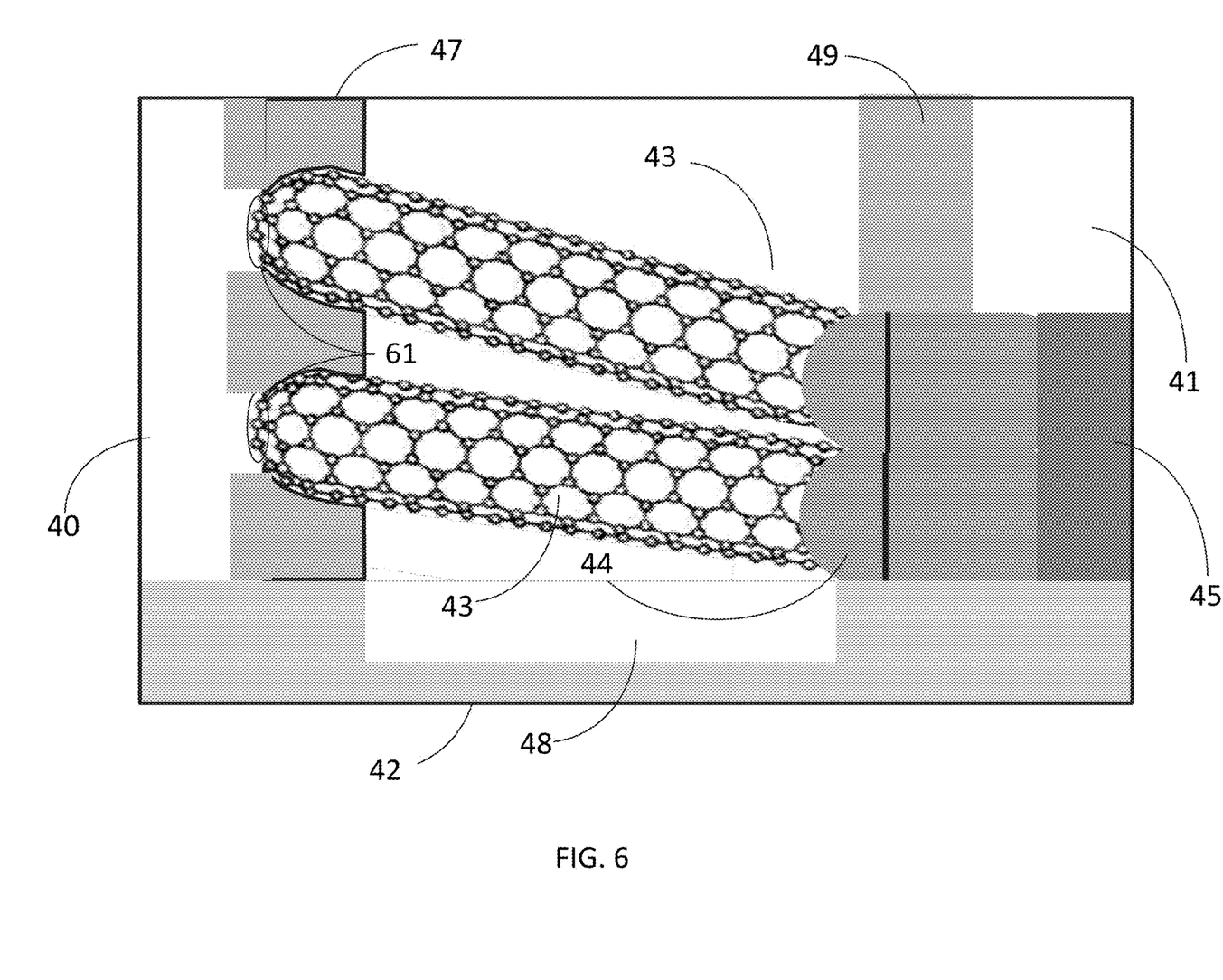

Reference is now made to FIG. 6, another diagram of a cross-section of an antenna array depicting multiple diodes and CNT antennas according to another aspect of the present disclosure. Subsequent to the formation of geometric diodes, additional oxide may be grown to eliminate further migration of the metal from the carbon nanotube tip to the surface of the oxide. In order to accomplish this, one may allow the metal 40 and 41 to migrate through the oxide 47 and 49 respectively, until the migration naturally stops, without allowing the metal 40 to migrate from the tips 61 of the CNT antennas 43. This may be performed by applying an electrical bias sufficient enough to hold the metal ions at the tip of the CNT antennas, while allowing the metal ions elsewhere to migrate to the surface of the oxide to form more oxide. For example aluminum oxide may grow on pure aluminum as aluminum ions migrate through the aluminum oxide to oxidize in the presence of oxygen in the air, but the process may typically stop after 3.5 to 4.5 nanometers of oxide has grown, when the natural electric fields are too weak to cause further migration. In this manner the tips 61 of the CNT antennas 43, may be "anchored" in the oxide 47, while also stabilizing the aluminum ion migration.

In order to efficiently rectify visible light, the diodes may need to have a cutoff frequency above 700 THz. This may require diodes 46 in FIG. 4 with sufficiently small capacitance, which may be accomplished by growing CNTs approximately 15 nanometers in diameter to very thin oxides one to two nanometers thick. Nevertheless, even with such thin oxides, the turn-on voltage of the resulting diode may limit the rectification of infrared light. On the other hand, the small tip 51 of the CNT in FIG. 5, directly connecting to the large flat side of the power line may create a geometric diode, which may have a turn-on voltage close to zero, which may thus allow rectification of the entire spectrum of sunlight. Furthermore, the antennas' lengths and directions may vary to cover substantially the entire spectrum of un-polarized sunlight. This may be accomplished by varying the distances the carbon nanotubes 43 cover from the ground 41 line to the power line 40, such that the difference of the shortest to the longest carbon nanotube may be greater than the difference between a ¼ wavelength of ultraviolet light (~80 nanometers) and ¼ wavelength of infrared light (~640 nanometers). This may ensure that at least one harmonic of substantially all frequencies of sunlight may be covered by the range of CNT lengths.

Techniques for depositing and etching very thin layers of materials have been well known in the semiconductor industry for decades, but creating molecular-sized structures normally requires extremely expensive lithography equipment. In yet another aspect of the present disclosure, in the proper environment (alternating lines of metal that may have been mechanically patterned, polished and etched may be placed in a chemical vapor deposition machine), a plurality of first molecular-sized structures (e.g., CNT antennas) may be created (e.g., grown between lines of metal), and a plurality of second molecular-sized structures (e.g., geometric diodes) may be created using the first molecular-sized structures (e.g., by applying an electrical bias between the lines of metal and the CNT antennas), which may together form a final structure (e.g., a rectenna array), which may perform the desired function (which, in the present case, may be electrically rectifying sunlight), where each of the first molecular-sized structures may be self-aligned to a respective one of the second molecular-sized structures (e.g., the geometric diodes that may be formed at the tips of the CNT antennas).

Alternatively, in yet another aspect of the present disclosure, in the proper environment (alternating lines of metal that may have been mechanically patterned, polished, etched and oxidized, may be placed in a chemical vapor deposition machine), a plurality of first molecular-sized structures (e.g., CNT antennas) may be created (e.g., grown between lines of metals), a plurality of second molecular-sized structures (e.g., MoC diodes) may form in connection with the first molecular-sized structures (e.g., by coupling the tips of the CNTs to the oxide on the metal lines), and by using the first and second molecular-sized structures (e.g., by applying an electrical bias across the MoC diode), a plurality of third molecular-sized structures (e.g., geometric diodes), may be created in place of the second molecular-sized structures. The first and third molecular-sized structures together may form a final structure (e.g., a rectenna array), which may perform the desired function (e.g., electrically rectifying sunlight), where each of the first molecular-sized structures may be self-aligned to a respective one of the third molecular-sized structures (e.g., the geometric diodes that may be formed at the tips of the CNT antennas).

It is also contemplated that further processing using this resulting structure, which is a combination of two separate molecular-sized structures, may be used to preserve the resulting structure while enhancing the stability of the resulting structure by adding the additional oxide to stabilize and "anchor" the geometric diodes.

It will be appreciated by persons skilled in the art that the present invention is not limited by what has been particularly shown and described hereinabove. Rather the scope of the present invention includes both combinations and subcombinations of various features described hereinabove as well as modifications and variations which would occur to persons skilled in the art upon reading the foregoing description and which are not in the prior art.

We claim:

1. A method to construct a plurality of molecular-sized structures to perform a specific function, the method comprising, in order, and without intervening actions:
   a) creating an appropriate environment to create the molecular-sized structures;
   b) creating a plurality of first molecular-sized structures in the appropriate environment;
   c) creating a plurality of second molecular-sized structures, using the first molecular-sized structures; and
   d) combining respective ones of the plurality of first molecular-sized structures and respective ones of the plurality of second molecular-sized structures to form a plurality of final structures;

wherein the plurality of final structures is enabled to perform the specific function, and wherein the appropriate environment includes alternating lines of metal that are set to different respective voltage levels.

2. The method in claim 1 wherein the respective ones of the plurality of first molecular-sized structures are self-aligned to the respective ones of the plurality of second molecular-sized structures.

3. The method in claim 1, wherein the method further comprises creating the alternating lines of metal by mechanically patterning, polishing and etching, and wherein the appropriate environment includes the alternating lines of metal placed in a chemical vapor deposition machine.

4. The method in claim 3, wherein the creating the plurality of first molecular-sized structures includes growing carbon nanotube antennas between the alternating lines of metal.

5. The method in claim 4, wherein the creating the plurality of second molecular-sized structures using the first molecular-sized structures includes forming a geometric diode by applying a bias voltage between the alternating lines of metal and the carbon nanotube antennas.

6. The method in claim 5, wherein the plurality of final structures are rectennas.

7. The method in claim 1, further including: e) using each of the plurality of final structures to preserve the respective final structure.

8. The method in claim 7, wherein preserving the respective final structure includes applying a bias voltage to the respective final structure while adding oxide around the respective final structure.

9. The method in claim 1, wherein the plurality of final structures are rectennas.

10. The method in claim 1, wherein the different respective voltage levels are a ground voltage and a negative voltage.

11. The method in claim 3, wherein the different respective voltage levels are a ground voltage and a negative voltage.

* * * * *